(12) United States Patent
Anandan

(10) Patent No.: US 7,202,602 B2
(45) Date of Patent: Apr. 10, 2007

(54) METAL SEAL PACKAGING FOR ORGANIC LIGHT EMITTING DIODE DEVICE

(75) Inventor: Munisamy Anandan, Del Valle, TX (US)

(73) Assignee: Organic Lighting Technologies LLC, Austin, TX (US)

( * ) Notice: Subject to any disclaimer, the term of this patent is extended or adjusted under 35 U.S.C. 154(b) by 0 days.

(21) Appl. No.: 10/818,042

(22) Filed: Apr. 5, 2004

(65) Prior Publication Data

US 2004/0201348 A1 Oct. 14, 2004

Related U.S. Application Data

(60) Provisional application No. 60/461,099, filed on Apr. 8, 2003.

(51) Int. Cl.
*H05B 33/00* (2006.01)

(52) U.S. Cl. .................. 313/512; 313/504; 313/509

(58) Field of Classification Search ............ 313/512, 313/504, 506, 509, 549, 561, 553; 428/917; 257/88, 100; 315/169.3
See application file for complete search history.

(56) References Cited

U.S. PATENT DOCUMENTS

| | | | |
|---|---|---|---|
| 6,573,652 B1 * | 6/2003 | Graff et al. | 313/512 |
| 6,628,071 B1 * | 9/2003 | Su | 313/512 |
| 6,657,382 B2 * | 12/2003 | Nagai et al. | 313/512 |
| 2004/0119403 A1 * | 6/2004 | McCormick et al. | 313/506 |

* cited by examiner

Primary Examiner—Ashok Patel

(57) ABSTRACT

A metal sealed organic light emitting diode device comprising a lid, containing a recessed portion to accommodate large quantity of getter/dessicant, a band of metal stack at the perimeter over which is laid a band of low temperature melting solder alloy, pre-tinned subsequently, and a substrate. The substrate containing organic light emitting diode at the central area with a band of metal stack at the perimeter. The lid and the substrate are placed together in substantial alignment such that the pre-tinned low melting solder band of the lid contacts the metal stack of the substrate and thermally sealed in a controlled atmosphere. Multiples of substrates are sealed with a single lid containing multiplicity of recessed portions with multi-segmented metal stack and pre-tinned solder band to derive a large area device.

11 Claims, 10 Drawing Sheets

METAL SEAL PACKAGING FOR ORGANIC LIGHT EMITTING DIODE DEVICE

CROSS REFERENCE TO RELATED APPLICATION

Benefit of Provisional Application No. 60/461,099 filed Apr. 8, 2003
U.S. Pat. No. 6,608,283—Liu et.al, Aug. 19, 2003.
U.S. Pat. No. 6,198,220—Jones et.al, Mar. 6, 2001
U.S. Pat. No. 6,706,316—Ghosh et.al, Mar. 16, 2004
U.S. Pat. No. 6,570,325—Graff et.al, May 27, 2003
U.S. Pat. No. 6,614,057—Silvernail et.al, Sep. 2, 2003

OTHER PUBLICATIONS

R. K. Traeger, "Hermeticity of ploymeric lid sealants"—Proceedings of 25th Electronics Components conference, pp. 361–367, April 1976

Yoshihisa Tsuruoka et.al, "Transparent thin film dessicant for OLEDs"-pp. 860–863, Digest of Technical papers, SID'03, May 2003.

D. C. Jones et.al, "Water ingression and condensation in sealed system"—Proceedings of Nat. Tech. Conf. On plastics in packaging, p. 45, 1969.

W. J. Kass,—unpublished work, Sandia Labs/Albuquerque, N. Mex., May 1974

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISK APPENDIX

Not Applicable

BACKGROUND OF THE INVENTION

Organic Light Emitting Diode (OLED) display technology is a new wave in flat panel displays and expected to challenge the most popular Liquid Crystal Displays (LCDs) in many applications. A basic structure of OLED consists of an anode and a cathode between which is sandwiched a multi-layer organic thin film that generates light when electrons and holes recombine, as a result of sufficiently applied voltage, at the organic layer. The organic films and at least one metallic film are sensitive to the presence of water vapor and oxygen. As a result, one of the major problems faced by OLED is its longevity. The presence of oxygen and water vapor beyond one part per million (ppm) inside the device can deteriorate the performance of OLED. The material undergoes oxidation in the presence of oxygen and water vapor. Metallic film employed for cathode layer is sensitive for de-lamination under this environment. The end result is the marked decrease in brightness and formation and spreading of 'black spots' that is characterized by islands of no light emission. There are two mechanisms of degradation of light emission. One is due to the intrinsic nature of the organic materials that is responsible for overall uniform decrease in light emission and the other is due to the reaction of oxygen and water vapor that results in 'black spots'. Uniform degradation of light output, due to intrinsic aging nature of organic materials, can still render the device useful as a display with reduced brightness, whereas the black spots tend to spread, both during operation and storage, and thus render the device useless as a display. Hence the latter mechanism is more serious than the first.

Foregoing demands serious consideration in the hermetic sealing of OLED devices against oxygen and water vapor, particularly the materials employed for hermetic sealing medium. The seal process is normally carried out in a moisture and oxygen controlled, less than 1 ppm, glove box, after the OLED has been processed and automatically transferred to the glove box. A mathematical model for the permeation of moisture through seals is given by, $$t = (V.L/P.A.R.T)\ln[(P_0-P_1)/(P_0-P_2)]$$

Where t is the time in seconds to reach $P_2$
V is the free volume of the device ($cm^3$)
L is the diffusion path length or seal width (cm)
P is the permeability of the sealant (g/cm sec torr)
A is area of the seal exposed to the permeant ($cm^2$)
R is the gas constant (3465 torr $cm^{30}$/K $gH_2O$)
T is the temperature ($^{\circ}K$)
$P_0$ is the external water vapor pressure in torr
$P_1$ is the initial internal water vapor pressure in torr
$P_2$ is the final internal water vapor pressure in torr Most important factors to be considered for a good hermetic sealing is the geometry of the seal namely, width, length and height and the material of the seal. Width of the seal, for planar geometry like OLED, plays a major role due to the permeation length and hence dimensions of width in the range of microns is totally insufficient. It needs to be in fractions of millimeter. Other significant factor is the material of the seal. FIG. 1, to follow in the description, gives permeation rates of moisture in various materials like, silicones, epoxies, fluorocarbons, glasses and metals for different thickness (width) of the seal. It can be seen from the figure, the best material of choice is the metal. This invention relates to a metal seal for OLED.

Prior art employed various types of seal for OLED. Primarily the methods fall in to two categories namely, perimeter seal and encapsulation seal. In some cases a combination of perimeter and encapsulation seals were employed. Encapsulation method relates to the complete intimate sealing of OLED structure by depositing sealant layers on top of the structure. Perimeter method relates to the sealing of the device at the edges of OLED structure, with its substrate, through the use of a lid. Jones et.al (U.S. Pat. No. 6,198,220) described an encapsulation method that incorporated alternate thin film layers of dielectric and metallic films over the OLED structure. The thickness of each layer was in the range of thousands of angstroms. Jones et. al stated that the pin-holes in the layers are self-sealed by the reaction of moisture around the hole. Before this reaction is complete, the moisture can pass through pin-holes to the sensitive layers of the device and damage the device. Hence, this is not a reliable method. Further, these films deposited through plasma enhanced chemical vapor deposition (PECVD), sputtering and CVD in a multi-layer stack are stressful and develop micro-cracks, in addition to being porous. Further, the UV from the plasma can cause damage to the organic films. Liu et.al described a laser method of solder seal (U.S. Pat. No. 6,608,283) in which a metallic flange containing a glass window was sealed to the substrate containing active matrix OLED structure. The heat developed during this process was so high to incorporate a heat sink to protect OLED from thermal damage. As the laser seal needs to be done fast to prevent the development of heat, the stress introduced during this process can cause damage to the glass window that is pre-sealed to the metallic flange.

Further this method is susceptible for 'bubble-trap' due to its transient nature. Ghosh et.al described (U.S. Pat. No. 6,706, 316) an ultra-sonic method of solder metal perimeter seal to protect the OLED structure. A recessed holder, and a high pressure in the range of 80–100 psi, was necessary to accomplish the seal. The surfaces of the lid and the substrate, employed for the seal, were of dielectric. The molten metal can not establish good bond to these surfaces. Hence this method of hermetic seal is not reliable. Graff et.al described multi-layer barrier coatings, encapsulation method, on OLED claiming the use of almost all types of materials known in the literature and stating that there is no limit on the thickness of these coatings. It is well known in the literature that there is a stress created in multi-layer coatings that leads to micro-cracks in the coatings. Multi-layer coatings on OLED, done so far, never exceeded a few microns. For a good seal, seal thickness should be in substantial fractions of mm. Silvernail et.al described (U.S. Pat. No. 6,614,057) a perimeter seal that has two adjacent layers with no gap between them. The inner layer is claimed to protect the out-gassing from the outer layer during the curing process. However, the inventors employed inner layers out of UV epoxy and thermal epoxy, which is known to out-gass during the curing process and further two adjacent seals of different materials increase the process steps and cost of manufacture.

BRIEF SUMMARY OF THE INVENTION

From the foregoing it is clear that a good hermetic seal is necessary to suppress the permeation of moisture and oxygen in to the OLED device to enhance the life performance of OLED. The best sealing material known to perform this function effectively is metal. The width of the seal needs to be in the substantial fractions of millimeter. This invention is on the perimeter metal sealing of OLED employing low melting eutectic alloys of solder metals. Illustration, shown subsequently, is for OLED with down-emitting structure in which the light output is through anode and the invention is equally applicable to up-emitting structure in which the light output is through cathode. A substrate, containing anode, cathode and a multi-layer organic stack comprising hole injection layer, hole transport layer, light generation layer and electron transport layer, is sealed by a metal seal to a lid containing an activated getter material that absorbs moisture and oxygen.

Prior to the metal sealing process, the substrate containing the transparent anode is applied with a dielectric layer at the perimeter to a width of 1 mm and thermally processed. A stack of metal layers is vacuum deposited on top of the dielectric layer to a width of 1 mm and a thickness of 1 micron. Alternatively, the stack can also be electroplated to a thickness of a few microns. Another alternative method is to screen print a single metal layer to a thickness of 12–25 microns and thermally process the print. Sputtering is still another alternative method to accomplish the same task. The substrate prepared in this manner undergoes the OLED process inside a vacuum chamber. After the completion of the OLED process, the substrate is loaded in side a controlled Nitrogen glove box that is maintained to control moisture and oxygen levels less than 1 ppm. The top lid can be either a metallic tray or glass with a recess. If the lid is made of metallic tray, it is screen printed at the perimeter, excluding recess portion, at the same location as in the substrate with a metallic solder paste to a width of 0.5 mm and to a thickness of 12–25 microns and thermally pre-processed. If the lid is made of glass, a metallic stack is first applied through vacuum deposition or sputtering, at the perimeter, at the same location as in the substrate to a thickness of 1 micron and a width of 1 mm. Alternate methods are screen printing to a thickness of 12–25 microns or sputtering to 1 micron or electroplating to 2–5 microns, keeping the width as 1 mm. Over this layer, a layer of metallic solder paste is screen printed to a width of 0.5 mm and to a thickness of 12–25 microns and thermally pre-processed. Next step involves locating a getter/dessicant in the recessed area of the lid and activating the getter/dessicant inside the glove box either in vacuum oven or on a hot plate. The recessed area, for a metal tray, contains a spot welded wire mesh that can hold substantial quantity of dessicant/getter, when screen printed on the mesh. The recessed area, if made of glass, is sand-blasted to enhance the area of dessicant/getter, when screen-printed.

Both the substrate and the lid processed in this manner are aligned in a jig inside the glove box so as to make 0.5 mm wide metal layers, on both substrates, to be in contact. The assembly is thermally sealed inside the nitrogen glove box with least out-gassing from the metal layers, as these layers were thermally pre-processed. For certain special large area applications and for large area OLED backlight applications, multiple patterns of OLED substrates can be sealed to an integrated single lid with multiple recessed areas.

It is an object of this invention to provide a high integrity metal seal to the OLED device against permeation of water vapor and oxygen. The improved method is readily manufacturable.

A further object of this invention is to reduce out-gassing, that can harm OLED, from the metal layers during sealing.

Yet another object of this invention is to seal multiple pattern or multiple substrates carrying OLED, employing this improved sealing method, to generate large area OLED display or OLED backlight for LCD.

A further object of this invention is to provide large getter/dessicant area in the lid for absorbing oxygen and moisture during the operation and storage of OLED.

DETAILED DESCRIPTION

Figure 1:
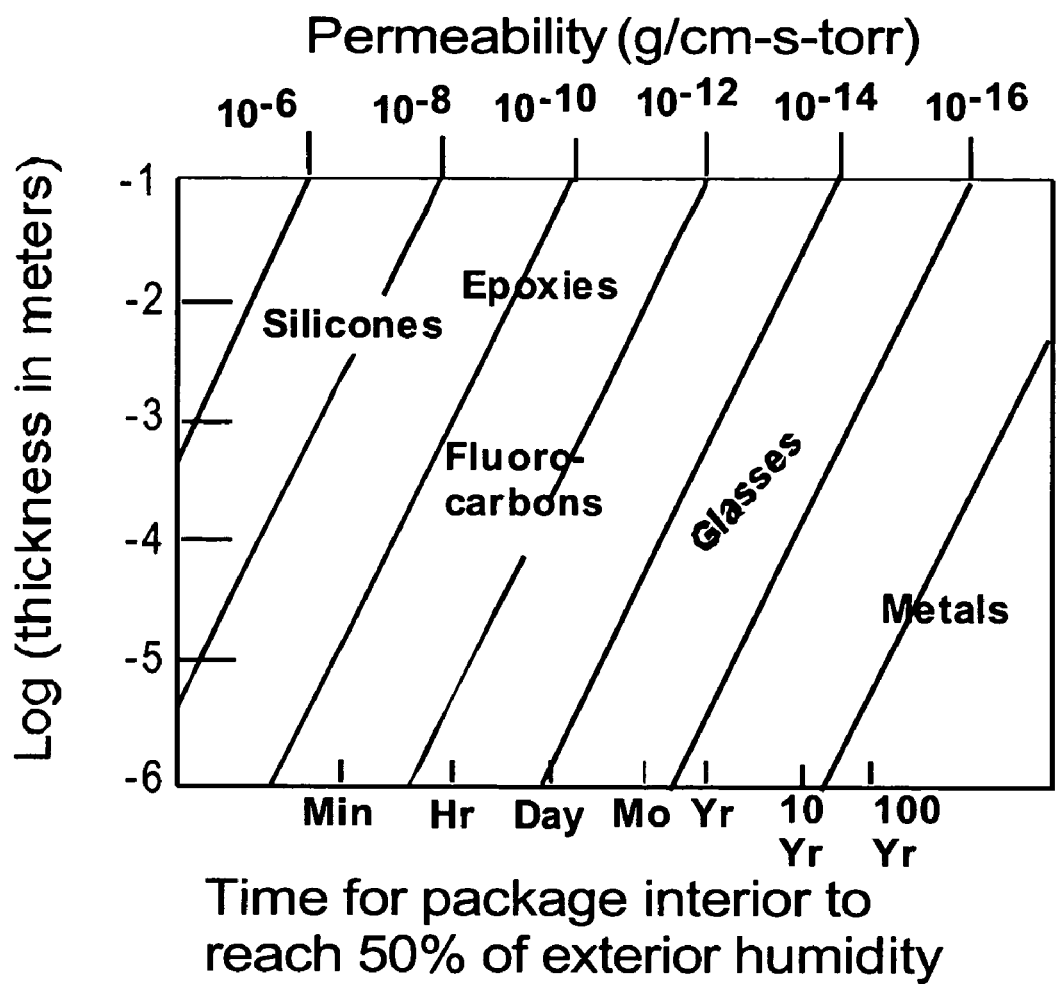
FIG. 1 is a graphic illustration of the moisture permeation rate for different materials of sealant and serves as a guideline for the choice of materials.

FIG. 1 is a graphic illustration of moisture permeation through different materials of seal with different thickness plotted on Y-Axis and the time for the interior of the device to reach 50% of the exterior humidity plotted at the bottom of X-Axis. At the top of X-Axis is plotted the permeability in gms/cm, sec, torr for various materials. FIG. 1 depicts the thickness of the sealant, through which moisture permeates, starting from 1 micron on Y-Axis. For a thickness of 1 micron, it is evident from FIG. 1 that for metal seal, it takes years for the interior of the device to reach 50% of exterior humidity. Under these conditions, epoxy seals take only days to reach 50% of exterior humidity. Although the devices like OLED will be terminating its life performance by the time the interior humidity reaches 50%, the graph illustrates that the metal seals are the best against moisture permeation.

Figure 2:
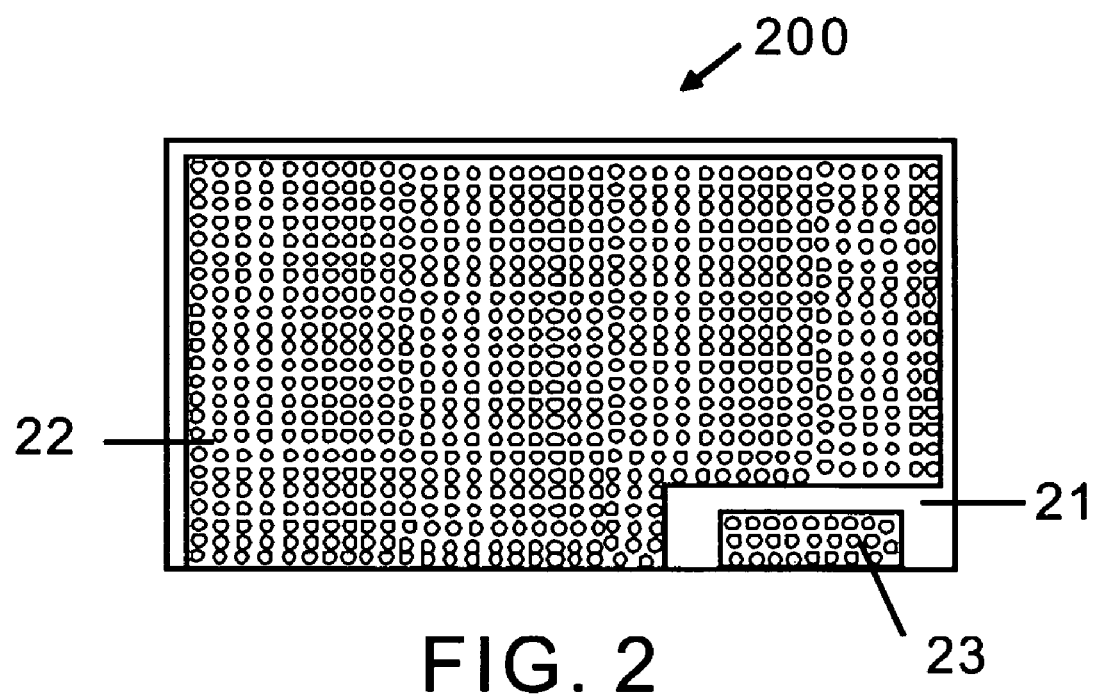
FIG. 2 is a plan view of OLED substrate containing anode and cathode lead out.

FIG. 2 is the bottom substrate 200 containing the transparent anode 22 of OLED and cathode lead out 23 on a glass substrate 21. The anode is of Indium Tin Oxide (ITO) layer, deposited and patterned on only one surface of substrate 21, to a few fractions of a micron and is electrically conductive and optically transmissive.

Figure 3:
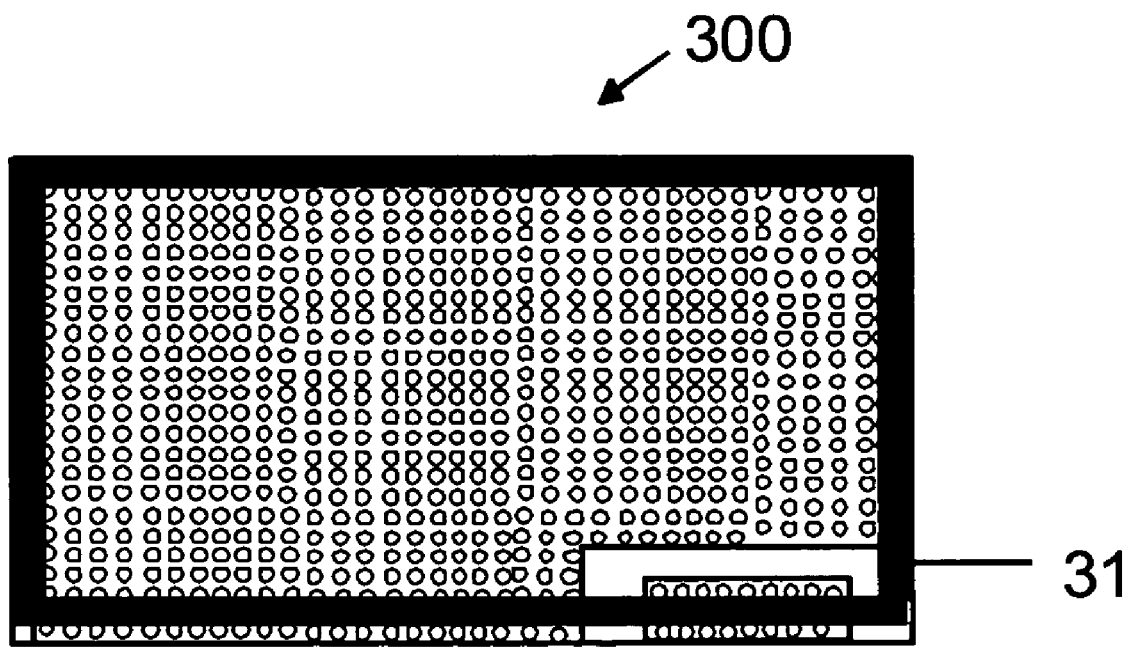
FIG. 3 is the same as FIG. 2 except for the additional dielectric layer at the perimeter.

FIG. 3 is the dielectric band coated glass substrate 300 that has dielectric band 31 formed at the perimeter. The dielectric layer 31 is preferably screen printed to a thickness of 25 microns, using a low melting glass frit paste such as Corning 7570, but not limited to, and thermally processed. The process temperature is around 450 C for 15 minutes in air to over-glaze the surface of ITO, thereby forming an insulating perimeter band on the substrate 300 to a final thickness of 12–15 microns.

Figure 4:
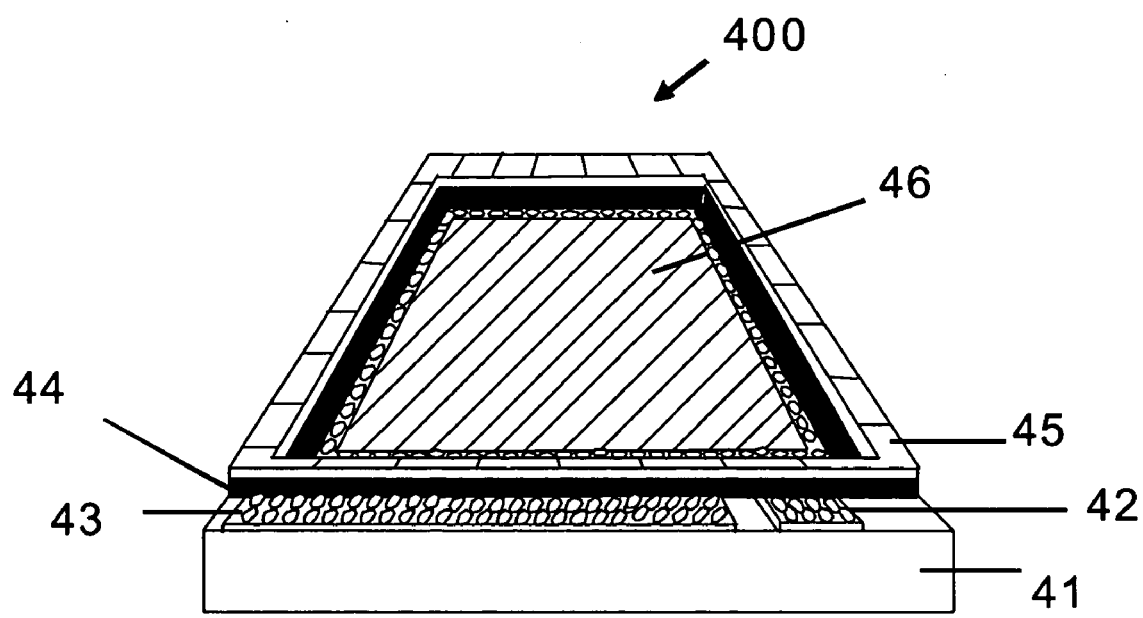
FIG. 4 shows an isometric view of OLED substrate with metal stack over the dielectric layer at the perimeter and OLED stack at the center.

FIG. 4 shows the OLED processed substrate 400 with the base glass plate 41 over which is the ITO anode 43, cathode lead out 42 with a perimeter band containing the dielectric layer 44 and a metal stack 45. The center portion of the substrate 400 contains an OLED stack 46 of organic layers with a reflective cathode. During the formation of OLED layers, it is important that metal stack 45 is protected from having any residual deposit of any material during OLED processing. The metal stack 45 is formed, on the dielectric layer 44, by vacuum deposition. By employing a shadow mask Ti./TiO$_2$ is deposited to a thickness of 2000 A, followed by Ni, to a thickness of 9000 A and finally by Au to a thickness of 2000 A with a bandwidth of 1 mm. Other materials for the stack 45 include, but not limited to, Cr—Ni—Au, Cr—Ni—Ag, Cr—Cu—Ag, Ti/TiO$_2$—Ni—Ag, Cr—Cu—Ni and DuPont 7713 silver. To obtain DuPont 7713 silver, the substrate undergoes screen printing of 7713 silver paste to a thickness of 25 microns and thermal processing around 450 C for 15 minutes to result in a silver thickness of around 15 microns with a strong bond to the dielectric layer 44 underneath. If the stack 45 is obtained through vacuum deposition by any combination of the materials stated above, the range of thickness of bottom layer is 500 A–5000 A, middle layer to 2000 A–7000 A and the top layer to 5000 A–10000 A.

Figure 5A:
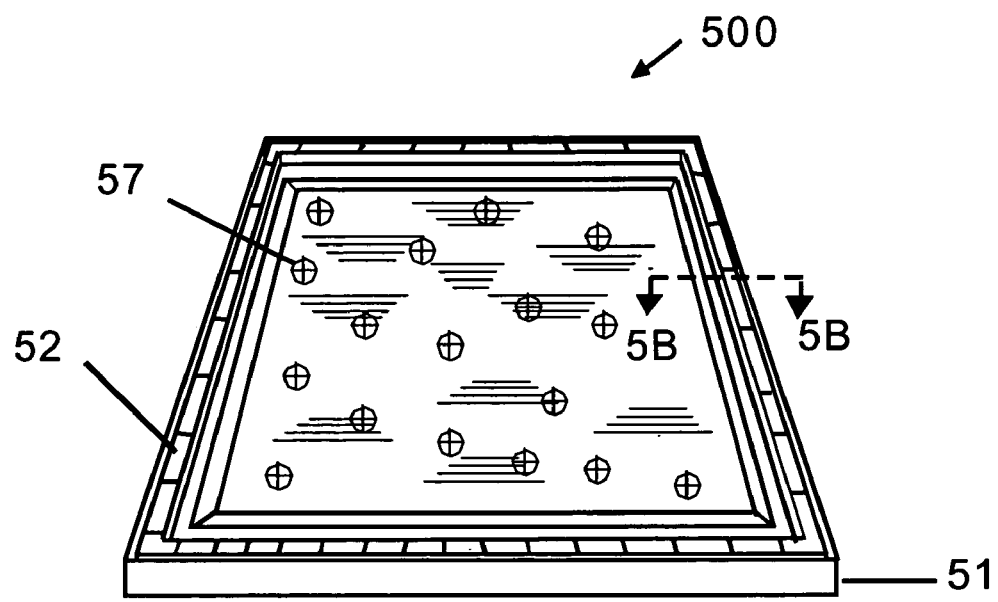
FIG. 5A is an isometric view of top lid with metal stack at the perimeter and dessicant at the center.

FIG. 5A shows the top lid 500 made of glass with a recessed region at the center containing getter/dessicant 57 and a perimeter metal stack 52 similar to the glass substrate shown in FIG. 4. The metal stack 52 is of the same materials, as described under FIG. 4. Alternate combinations are also the same. The dessicant/getter is applied, after forming the metal stack 52, to the center recessed portion employing preferably SAES company's GDO dessicant based on CaO. Alternative dessicant materials are BaO or SrO or Mgo mixed in a suitable binder/solvent and screen printed or doctor-bladed in the recessed portion of the lid, dried. Other alternative material is 'Oledry', from Futaba Corporation, which can be dispensed in solution form and dried. The activation of the getter/dessicant is deferred till a low temperature melting solder paste is printed on top of metal stack 52 and dried. 'Oledry' is transparent and hence can be applied to up-emitting OLED structure as well.

Figure 5B:
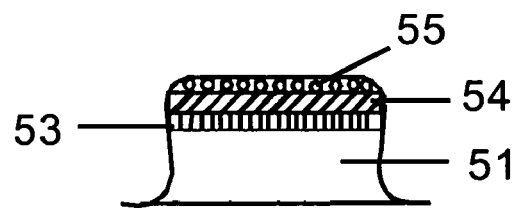
FIG. 5B is a cross section taken at the perimeter of FIG. 5A showing the details of metal stack.

FIG. 5B shows the cross section taken from FIG. 5A. The glass lid 51 is first deposited with a strongly adhering metal layer 53, like Cr or alternatively Ti. The second layer 54 is preferably Ni, followed by the third layer 55, preferably Au. Other alternative combinations of metal layers are as stated under FIG. 4.

Figure 6:
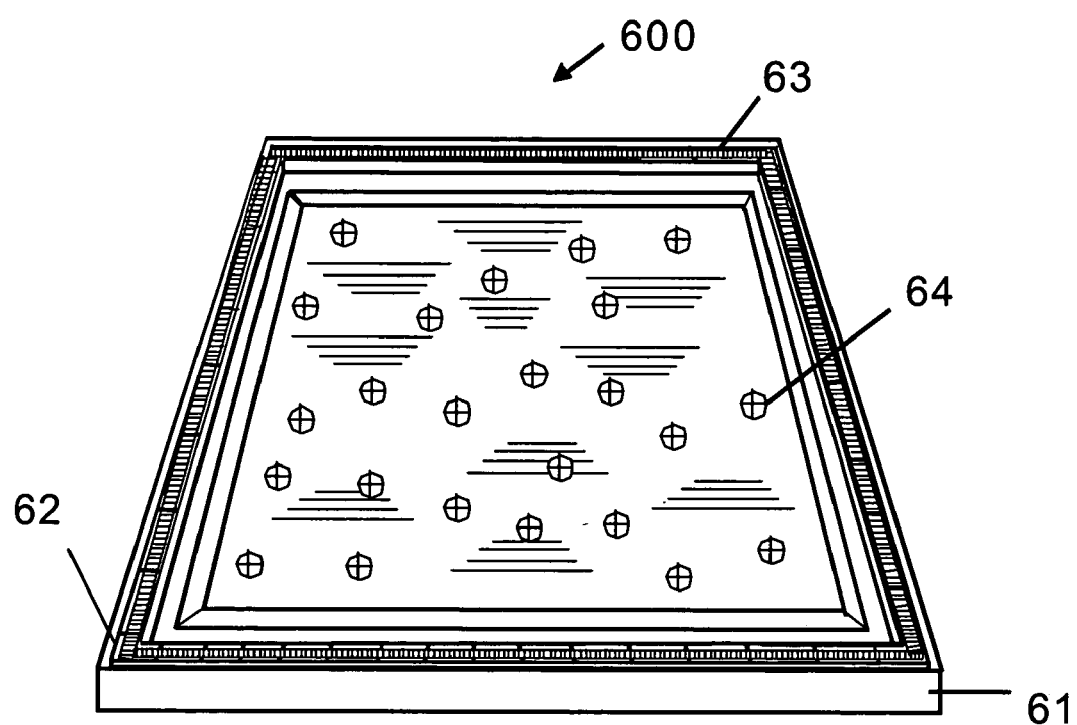
FIG. 6 is the same as FIG. 5 except for the additional low melting metal layer on top of the metal stack.

FIG. 6 depicts the lid 600 with the addition of a low temperature melting solder alloy 63 on the tri-metal stack 62 laid on glass plate 61. Low melting eutectic screen printable solder alloy, in the form of 'no-clean' paste, from Indium Corporation of America can be used to screen print or doctor-blade or stencil over the top layer of tri-metal stack 62. The print thickness is preferably around 75 microns. If alternate material DuPont 7713 silver is employed, replacing metal stack 62, then the top surface of thermally processed silver needs to be mildly buffed to remove oxides prior to the screen printing of low temperature melting solder paste. The screen-printed solder paste is dried around 70 C for 45 minutes. Dispensing the getter/dessicant described under FIG. 5A takes place after drying the solder paste. Pre-tinning of solder paste in Nitrogen environment is done at a temperature depending on the material of solder paste, but in any case the temperature should be around the activation temperature of getter/dessicant selected. It is important that the getter/dessicant and solder paste be chosen so that the getter/dessicant activation temperature and pre-tinning temperature of solder paste are close to each other. Another factor that is significant is the sealing temperature of the solder alloy in the final seal process. This temperature should be compatible with OLED materials employed for protecting them from thermal degradation. Exceeding activation temperature of getter/dessicant does not pose damage to the getter/desicant but exceeding the safe operating temperature of OLED will result in irreversible damage to OLED. Hence, great emphasis is laid on the choice of solder materials. Preferred solder alloys from Indium Corporation of America are listed in the following Table:

| Alloy Composition | | | | Melting point/ |
| --- | --- | --- | --- | --- |
| Bi | In | Pb | Sn | Range in ° C. |
| 49 | 23 | 18 | 12 | 58 |
| 46 | — | 20 | 34 | 96 |
| — | 52 | — | 48 | 118 |
| 58 | — | — | 42 | 138 |

Among the preferred alloys, the alloy containing 52 In and 48 Sn is the most suitable because, it is lead free and has a temperature range of melting around 118 C, which is safe for OLED materials. Hence this solder paste, after printing on metal stack 62, is pre-tinned around 120 C for 5 minutes under Nitrogen atmosphere. As most of the materials of getter/dessicant, described in the foregoing section, have the temperature of activation in the range of 120 C, the getter/dessicant gets, activated during pre-tinning process. As the pre-tinning is done in Nitrogen controlled atmosphere with the top lid open, all major out-gassing from the solder material is completed.

Figure 7:
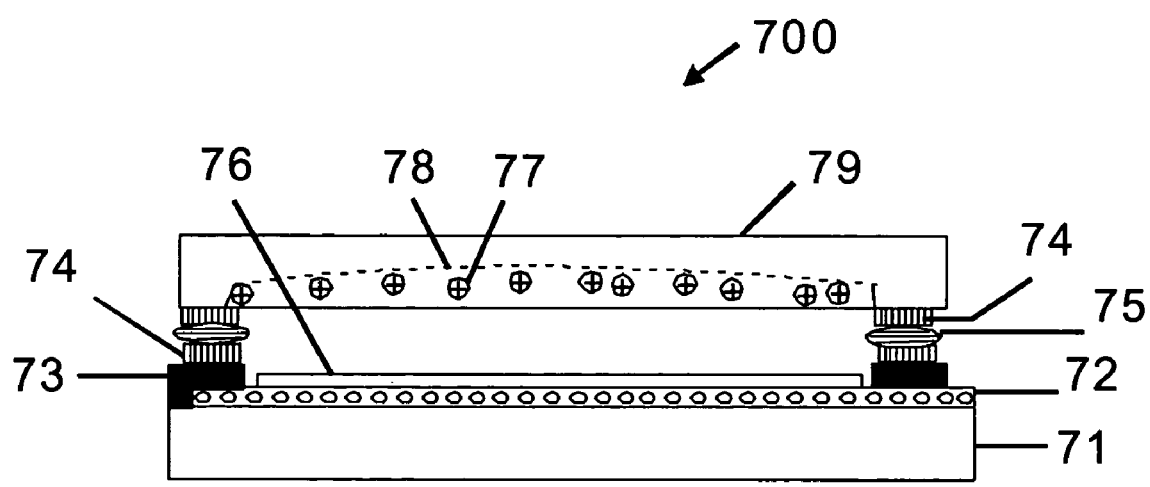
FIG. 7 is the cross section of top lid and OLED substrate sealed together at the periphery.

FIG. 7 is the cross section of a metal sealed assembly 700 that seals the top lid 79 to the bottom substrate 71. The OLED stack 76 is of 'down-emitting' type yielding light output through the transparent anode 72. The pre-tinned solder metal 75 on metal stack 74 of the top lid 79, that contains the getter/dessicant 77 in the recessed portion 78, is sealed to the bottom substrate 71 through the metal stack 74 on the dielectric layer 73. The sealing process is done, by aligning the top lid with bottom substrate so as to make the pre-tinned solder 75 contact, with light pressure, on the metal stack 74 symmetrically, on a hot plate, inside a controlled glove box, at a temperature of 125 C for 5 minutes. Gradual heating and gradual cooling is preferred during the thermal cycle.

Figure 8:
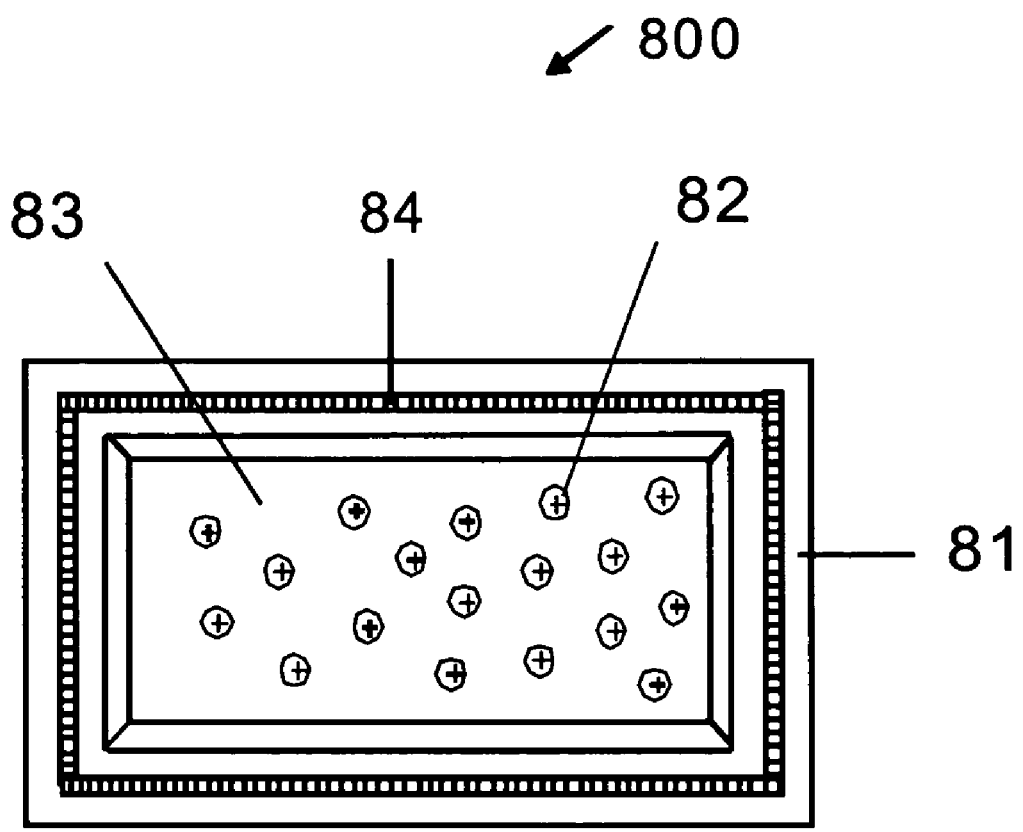
FIG. 8 is a plan view of top lid of another embodiment showing the dessicant and metal layer at the periphery.

FIG. 8 is another embodiment 800 of top lid 81 made of metal tray that contains getter/dessicant 82 in the recessed portion 83 and at the edge of this metal tray is the pre-tinned solder alloy 84. The solder application and thermal processes related to getter/dessicant activation are as described under FIG. 6. The metal tray is, preferably, made of Nickel-plated steel. Other preferred materials are Nickel-plated copper or stainless steel or Au plated Nickel.

Figure 9:
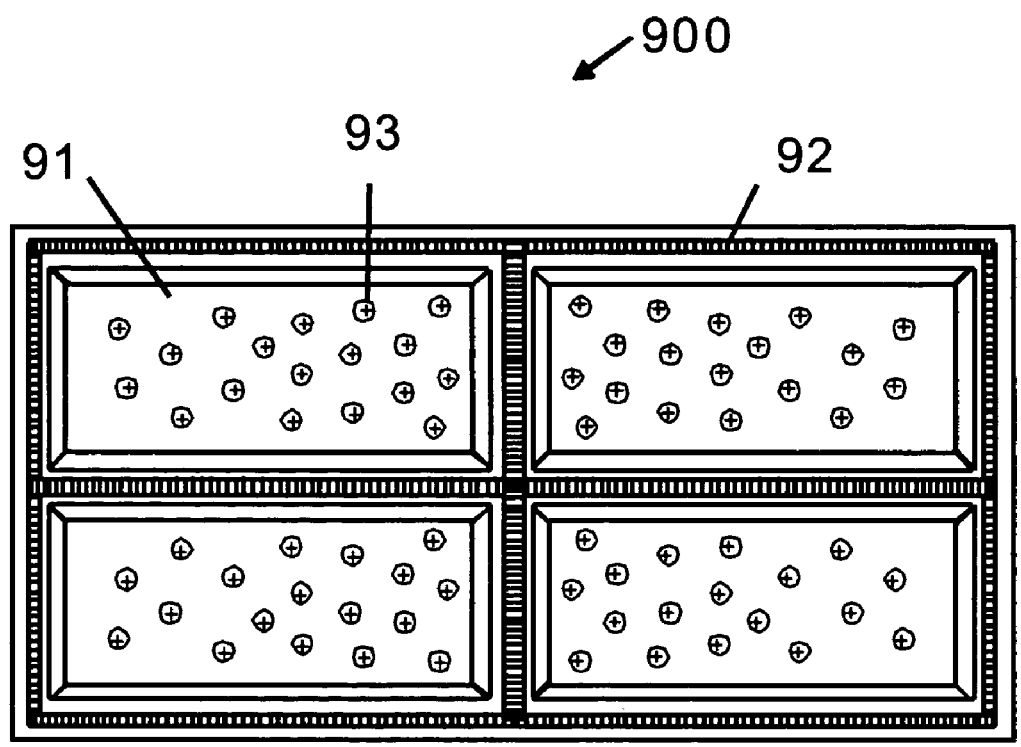
FIG. 9 is a plan view of top lid of another embodiment showing an integrated multiple lids.

FIG. 9 is a multiple pattern 900 of the top lid shown in FIG. 8. The lid 900 is a single integrated piece, containing multiples of top lids of FIG. 8. The solder alloy paste is screen printed at the edges of these multiples in one operation and thermally processed to obtain the pre-tinned solder band 92 together with the activation of getter/dessicant 93 contained in the recessed portions 91 of these multiples. This lid is advantageous for sealing to the individual OLED devices. As is known in the art of OLED, the yield of OLED devices decreases as the size increases because of the increase in defect density. This is especially true for backlight for LCDs. Under these circumstances, individual OLED devices contained on the substrates can be sealed to a common lid as shown in FIG. 9. For illustration purpose, only four compartments are shown and in practice the number of these compartments can be any practically possible number. Top lid 900 if made of glass should be deposited with metal stack prior to printing and pre-tinning of low temperature melting solder alloy.

Figure 10:
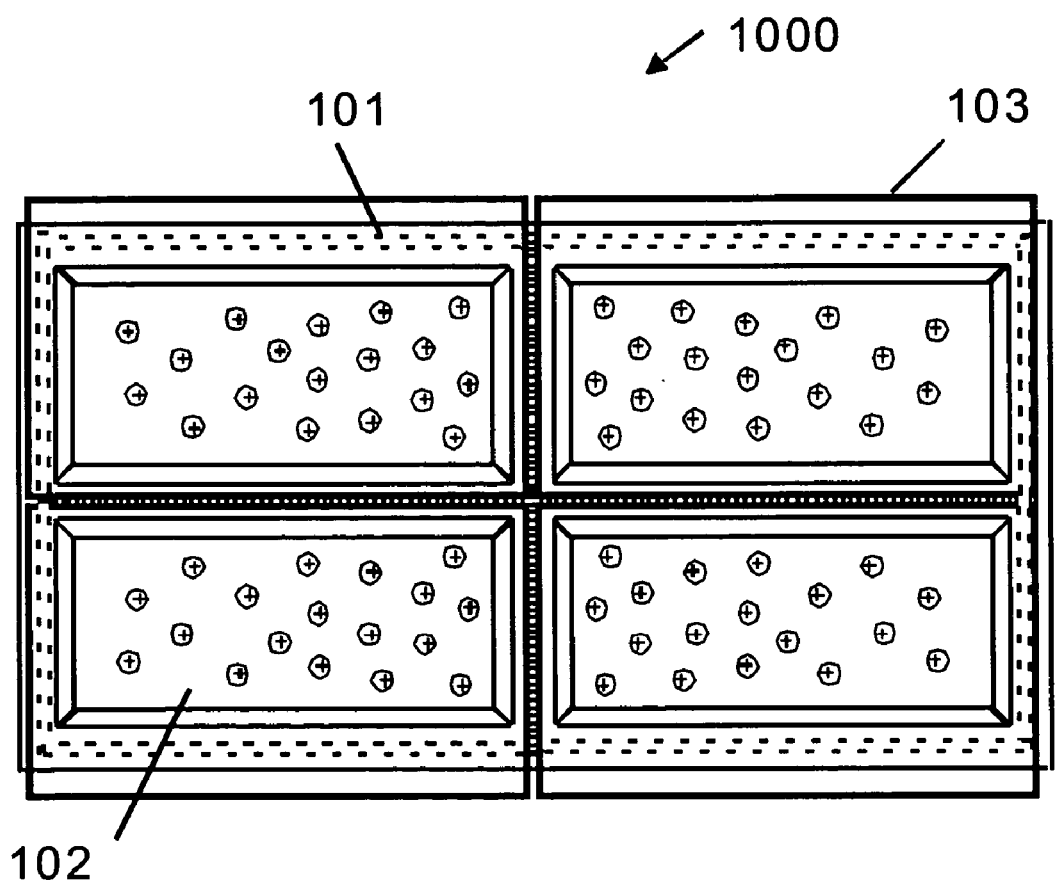
FIG. 10 is the plan view of several OLED substrates, metal sealed to the integrated multiple lids.

FIG. 10 is the multiple sealed assembly 1000 looking through the bottom of glass substrates 103. Again for illustration purpose, only four OLED substrates are shown. The number of substrates can be any practical number. The sealed portion 101 is shown as dotted underneath the glass substrate and the recessed areas 102 are opposite the interior surface of glass substrate but contained in the lids.

As a summary, process flow of the metal seal process is shown in the flow diagram below:

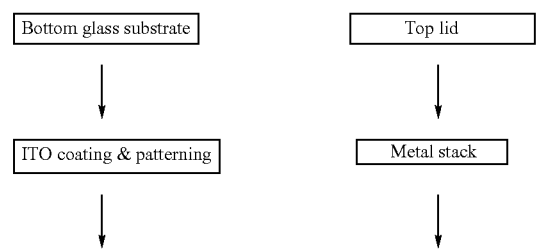
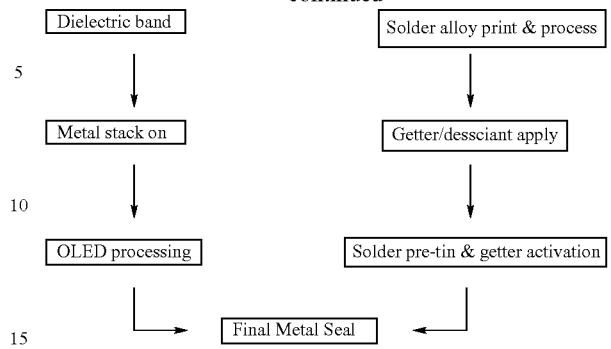

The invention claimed is:

1. A metal sealed organic light emitting diode device comprising:
   (1) a flat top lid assembly, made of a glass material or a metal material, and including an inner surface with a central recessed portion, said recessed portion providing a reservoir space for getter and desiccant, said getter and desiccant laid on said recessed portion to be in strong bond with said recessed portion, the top lid assembly further comprising:
      (a) a band of a first metal stack laid flat at a perimeter of the inner surface of said top lid assembly forming a strong bond with said inner surface of the top lid assembly; and
      (b) a band of a low temperature melting solder metal alloy laid flat on said band of a first metal stack and pre-tinned to be in strong bond with said band of a first metal stack; and
   (2) a bottom substrate assembly, made of either a glass material or a plastic material, and including an inner surface centrally containing a transparent anode and an active organic light emitting diode device, the inner surface of the bottom substrate assembly facing the inner surface of said top lid assembly, the bottom substrate assembly further comprising:
      (a) a band of a dielectric layer laid at a perimeter of the inner surface of said bottom substrate assembly to be in strong bond with a perimeter of the transparent anode and inner surface of said bottom substrate assembly; and
      (b) a band of a second metal stack laid over said band of a dielectric layer forming a strong bond with the band of a dielectric layer,
   wherein the top lid assembly and the bottom substrate assembly are placed in a substantial alignment and thermally sealed together in a pure nitrogen controlled environment.

2. A metal sealed organic light emitting diode device as claimed in claim 1 wherein the surface of the recessed portion of the top lid assembly is sand-blasted to increase the surface area over which the getter and desiccant is laid.

3. A metal sealed organic light emitting diode device as claimed in claim 2 wherein the getter and desiccant is composed of Calcium Oxide or Barium Oxide or Strontium Oxide or Aluminum Oxide or Magnesium Oxide or combinations of all these Oxides.

4. A metal sealed organic light emitting diode device as claimed in claim 1 wherein each of said first and second metal stacks comprises either Chromium layer-Copper layer-Nickel layer or Chromium layer-Nickel layer-Silver layer or Chromium layer-Nickel layer-Gold layer or Titanium layer-Nickel layer-Silver layer or Titanium layer-Nickel layer-Gold layer or Silver metal mixed with glass powder.

5. A metal sealed organic light emitting diode device as claimed in claim 4,
   wherein the first band of the metal stack includes a first metal in contact with the inner surface of the top lid assembly and the second band of the metal stack includes a first metal in contact with the inner surface of the bottom substrate assembly, wherein a thickness of each of the first metals of the first and second bands is in the range between 500 Angstroms and 5000 Angstroms;
   wherein the first band of the metal stacks includes a second metal in contact with the first metal of the first band and the second band of the metal stack includes a second metal in contact with the first metal of the second band, wherein a thickness of each of the second metals of the first and second bands is in the range between 2000 Angstroms and 7000 Angstroms; and
   wherein the first band of the metal stacks includes a third metal in contact with the second metal of the first band, facing the second metal of the first band wherein the second band of the metal stack includes a third metal in contact with the second metal of the second band, facing the second metal of the second band, wherein a thickness of each of the third metals of the first and second bands is in the range between 5000 Angstroms and 15000 Angstroms.

6. A metal sealed organic light emitting diode device as claimed in claim 1 wherein the material of low temperature melting solder alloy is composed of a combination of Indium and Tin or Indium, Tin and Lead in eutectic proportions.

7. A metal sealed organic light emitting diode device as claimed in claim 1 wherein said dielectric layer is composed of silicon dioxide or titanium dioxide or zirconium dioxide or aluminum dioxide or hafnium dioxide or Magnesium fluoride or combinations of these oxides or fused frit glass.

8. A metal sealed organic light emitting diode device as claimed in claim 7 wherein said dielectric layer has thickness in the range between 1 micron and 15 micron.

9. A metal sealed organic light emitting diode device as claimed in claim 1 wherein a width of said first and second metal stacks is between 0.1 mm and 2 mm and the width of the second band of the solder alloy is between 0.1 mm and 2 mm.

10. A large area metal sealed flat organic light emitting diode device comprising:
   (1) a flat top lid assembly, made of a glass material or a metal material, and including an inner surface with a plurality of centrally recessed portions, said plurality of recessed portions providing a reservoir space for getter and desiccant, said getter and desiccant laid on each of said recessed portions to be in strong bond with said recessed portions, the top lid assembly further comprising:
      (a) a band of a first metal stack laid flat at a perimeter of the inner surface of said top lid assembly bordering each of said recessed portions to be in strong bond with said inner surface of the top lid assembly; and
      (b) a band of a low temperature melting solder metal alloy laid flat on said first band of a metal stack and pre-tinned to be in strong bond with said band of a first metal stack; and
   (2) a bottom substrate assembly, made of a glass material or a plastic material, and including a plurality of substrate members, the bottom substrate assembly having an inner surface centrally containing a transparent anode and an active organic light emitting diode device, and facing the inner surface of said top lid assembly, the bottom substrate assembly further comprising:
      (a) a band of dielectric layer laid at a perimeter of the inner surface of said bottom substrate assembly to be in strong bond with a perimeter of the transparent anode and inner surface of said bottom substrate assembly; and
      (b) a band of a second metal stack laid over said dielectric layer forming a strong bond with the dielectric layer,
   wherein the top lid assembly and the bottom substrate assembly are placed in a substantial alignment and thermally sealed together in a pure nitrogen controlled environment.

11. A large area metal sealed flat organic light emitting diode device as claimed in claim 10 wherein the metal material of the top lid assembly comprises Nickel plated steel or Nickel or gold plated Nickel or stainless steel.

* * * * *